United States Patent
Mukherjee et al.

(10) Patent No.: US 9,653,559 B2
(45) Date of Patent: *May 16, 2017

(54) METHODS TO ENHANCE DOPING CONCENTRATION IN NEAR-SURFACE LAYERS OF SEMICONDUCTORS AND METHODS OF MAKING SAME

(75) Inventors: Niloy Mukherjee, Beaverton, OR (US); Gilbert Dewey, Hillsboro, OR (US); Marko Radosavljevic, Beaverton, OR (US); Niti Goel, Hillsboro, OR (US); Sanaz Kabehie, Portland, OR (US); Matthew V. Metz, Portland, OR (US); Robert S. Chau, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/997,166

(22) PCT Filed: Dec. 27, 2011

(86) PCT No.: PCT/US2011/067424
§ 371 (c)(1),
(2), (4) Date: Jun. 21, 2013

(87) PCT Pub. No.: WO2013/100914
PCT Pub. Date: Jul. 4, 2013

(65) Prior Publication Data
US 2013/0320417 A1 Dec. 5, 2013

(51) Int. Cl.
*H01L 29/417* (2006.01)
*H01L 29/40* (2006.01)
(Continued)

(52) U.S. Cl.
CPC .... *H01L 29/41725* (2013.01); *H01L 21/2254* (2013.01); *H01L 21/76814* (2013.01);
(Continued)

(58) Field of Classification Search
CPC ............. H01L 29/401; H01L 29/41725; H01L 21/76814; H01L 29/41783; H01L 29/66628; H01L 21/2254
See application file for complete search history.

(56) References Cited

U.S. PATENT DOCUMENTS 7,425,500 B2 * 9/2008 Metz et al. .................. 438/607
8,415,751 B2 * 4/2013 Mukherjee ........ H01L 29/66446
257/401

(Continued)

FOREIGN PATENT DOCUMENTS

| KR | 10-2006-0078005 A | 7/2006 | |
| KR | 10-2006-0080882 | 7/2006 | |
| WO | WO 2013/095375 A1 * | 6/2013 | .................... 257/369 |

OTHER PUBLICATIONS

Notice of Preliminary Rejection (Non-Final) from the Korean Intellectual Property Office (KIPO) dated Aug. 3, 2015 for Korean Patent Application No. 10-2014-7017412 and English Summary thereof.

(Continued)

*Primary Examiner* — Jarrett Stark
*Assistant Examiner* — Bitew Dinke
(74) *Attorney, Agent, or Firm* — Blakely, Sokoloff, Taylor & Zafman LLP

(57) ABSTRACT

A die includes a semiconductive prominence and a surface-doped structure on the prominence. The surface-doped structure makes contact with contact metallization. The prominence may be a source- or drain contact for a transistor. Processes of making the surface-doped structure include wet-vapor- and implantation techniques, and include annealing techniques to drive in the surface doping to only near-surface depths in the semiconductive prominence.

15 Claims, 6 Drawing Sheets

(51) Int. Cl.
  *H01L 21/225* (2006.01)
  *H01L 29/66* (2006.01)
  *H01L 21/768* (2006.01)
  *H01L 21/223* (2006.01)
  *H01L 21/265* (2006.01)

(52) U.S. Cl.
  CPC ...... *H01L 29/401* (2013.01); *H01L 29/41783* (2013.01); *H01L 29/66628* (2013.01); *H01L 21/2236* (2013.01); *H01L 21/26513* (2013.01)

(56) References Cited

U.S. PATENT DOCUMENTS

| | | | |
|---|---|---|---|
| 8,896,066 B2* | 11/2014 | Glass | H01L 29/78 257/368 |
| 9,153,583 B2* | 10/2015 | Glass | H01L 29/0847 |
| 2005/0037582 A1 | 2/2005 | Dennard et al. | |
| 2006/0118899 A1 | 6/2006 | Jang et al. | |
| 2006/0125019 A1 | 6/2006 | Levin et al. | |
| 2006/0157797 A1* | 7/2006 | Tateshita | 257/369 |
| 2007/0155063 A1* | 7/2007 | Datta | H01L 21/82380 438/142 |
| 2007/0298558 A1* | 12/2007 | Yamauchi et al. | 438/197 |
| 2008/0124878 A1* | 5/2008 | Cook et al. | 438/300 |
| 2009/0042344 A1* | 2/2009 | Ye et al. | 438/172 |
| 2009/0280612 A1* | 11/2009 | Shimamune et al. | 438/300 |
| 2010/0091537 A1 | 4/2010 | Best et al. | |
| 2010/0200835 A1* | 8/2010 | Jin et al. | 257/9 |
| 2010/0252862 A1* | 10/2010 | Ko | H01L 29/1054 257/192 |
| 2010/0252869 A1* | 10/2010 | Hokazono | 257/288 |
| 2010/0327377 A1* | 12/2010 | Dewey et al. | 257/411 |
| 2011/0042744 A1* | 2/2011 | Cheng et al. | 257/347 |
| 2011/0073952 A1 | 3/2011 | Kwok et al. | |
| 2012/0018848 A1* | 1/2012 | Huang et al. | 257/616 |
| 2012/0168877 A1* | 7/2012 | Mukherjee et al. | 257/401 |
| 2012/0187505 A1* | 7/2012 | Guo et al. | 257/401 |
| 2013/0089959 A1* | 4/2013 | Kwok et al. | 438/283 |
| 2013/0154016 A1* | 6/2013 | Glass et al. | 257/368 |
| 2013/0277769 A1* | 10/2013 | Tung et al. | 257/412 |
| 2013/0285155 A1* | 10/2013 | Glass et al. | 257/369 |
| 2014/0070276 A1* | 3/2014 | Ko et al. | 257/192 |
| 2014/0145246 A1* | 5/2014 | Ning et al. | 257/280 |

OTHER PUBLICATIONS

Office Action including Search Report issued by the Examiner of the Intellectual Property Office (IPO) for Taiwan Patent Application No. 101148106 and English translations thereof.
Notice of Second Preliminary Rejection from the Korean Intellectual Property Office (KIPO) dated Dec. 2, 2015 for Korean Patent Application No. 10-2014-7017412 and English Summary thereof.
Office Action including Search Report (7 pages) from the Taiwan Examiner of the Intellectual Property Office (KIPO) dated Nov. 11, 2016 for Taiwan Patent Application No. 104143859 and English Translation (6 pages) thereof.
PCT International Preliminary Report on Patentability (Chapter I of the Patent Cooperation Treaty) for PCT Counterpart Application No. PCT/US2011/067424, 6 pgs., ( Jul. 1, 2014).
International Search Report mailed Sep. 24, 2012 for PCT/US2011/067424, filed Dec. 27, 2011, 3 pages.
Notice of Preliminary Rejection (Non-Final) (4 pages) from the Korean the Intellectual Property Office (KIPO) dated Feb. 6, 2017 for Korean Patent Application No. 10-2016-7021518 and English Summary (1 p. 1) thereof Allowance Decision (2 pages) dated Mar. 16, 2017 from the Taiwan Intellectual Property Office for Taiwan Patent Application No. 104143859.

\* cited by examiner

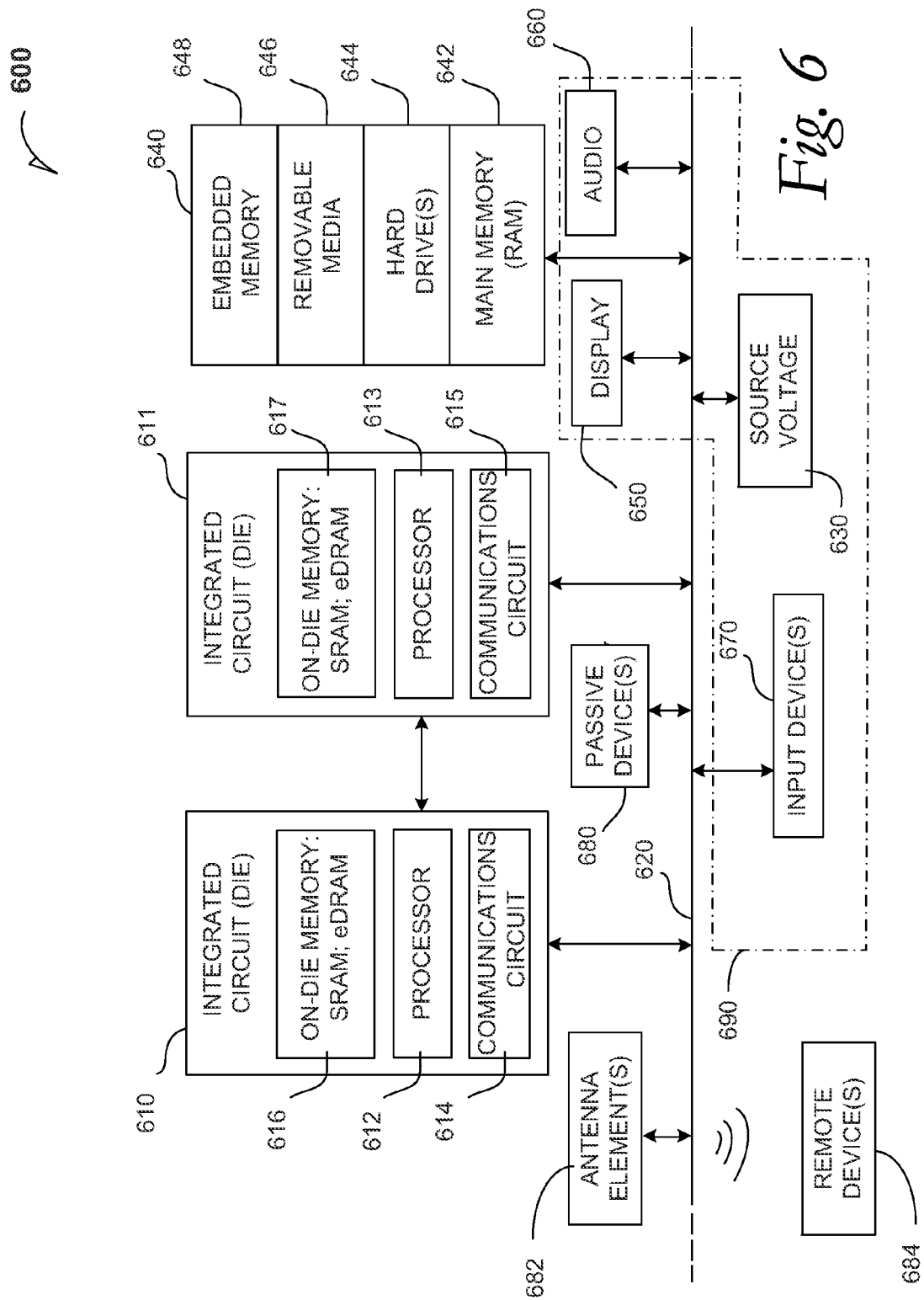

METHODS TO ENHANCE DOPING CONCENTRATION IN NEAR-SURFACE LAYERS OF SEMICONDUCTORS AND METHODS OF MAKING SAME

CROSS-REFERENCE TO RELATED APPLICATION

This patent application is a U.S. National Phase Application under 35 U.S.C. §371 of International Application No. PCT/US2011/067424, filed Dec. 27, 2011, entitled METHODS TO ENHANCE DOPING CONCENTRATION IN NEAR-SURFACE LAYERS OF SEMICONDUCTORS AND METHODS OF MAKING SAME.

TECHNICAL FIELD

Disclosed embodiments relate to contacts in semiconductive devices and methods to reduce contact resistance. Devices such as transistors are formed on a wafer and are connected using front-end metallization layers. The metallization layers include vias and interconnects that function as electrical pathways to interconnect the devices. Contacts connect the vias and interconnects to the devices.

BRIEF DESCRIPTION OF THE DRAWINGS

In order to understand the manner in which embodiments are obtained, a more particular description of various embodiments briefly described above will be rendered by reference to the appended drawings. These drawings depict embodiments that are not necessarily drawn to scale and are not to be considered to be limiting in scope. Some embodiments will be described and explained with additional specificity and detail through the use of the accompanying drawings in which:

FIG. 6 is a schematic of a computer system according to example embodiments.

DETAILED DESCRIPTION

Figure 1:
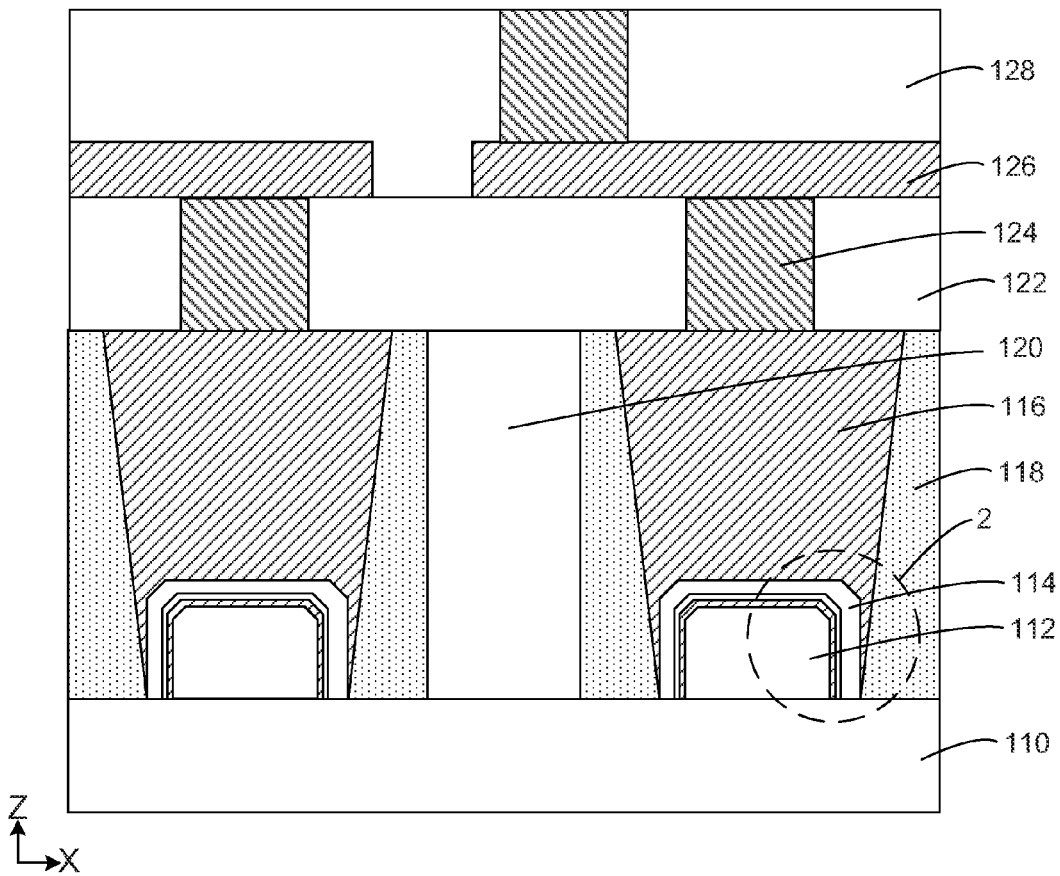
FIG. 1 is a cross-section elevation of an active device that includes a semiconductive prominence with a surface-enhanced doping concentration according to an example embodiment.

Processes are disclosed near-surface layers of contacts for semiconductive devices are doped to reduce contact resistance. Fabrication of contact near-surface layers includes surface or near-surface doping of the contact surfaces. Improved surface area for source- and drain (S/D) contacts results in reduced resistivity for the contacts by preserving electrical current qualities at the contacts.

Disclosed embodiments resist dopant deactivation/depletion in/from near-surface layers of semiconductor source/drains that may occur as a result of native oxide formation, etch- and surface-cleaning treatments, and damage from metal deposition processes. These deactivations/depletions are expected to be exacerbated as devices are further miniaturized. Contact resistance is inversely proportional to near-surface doping concentration. Thus, disclosed embodiments mitigate contact resistance increases due to miniaturization (also referred to as being "scaled").

As contact areas and device sizes are scaled, two effects are reduced by use of disclosed embodiments. First, the surface-area-to-volume ratio of the source/drain increases, which may cause a greater fraction of dopants to be deactivated/depleted due to effects of native oxide formation, dopant activation anneals, etch and surface cleaning treatments, and damage from metal deposition processes. Second, as the volume of the source/drain reduces, the number of dopant atoms required to cause significant changes in doping concentration will reduce. Disclosed embodiments lessen these two effects to result in sufficient doping density retained in the near-surface layers and greater heterogeneity such as site-to-site variation. Since the doping density in the near-surface layers impacts contact resistance, disclosed embodiments result in decreased contact resistance.

In a process embodiment, a trench is opened to expose a raised S/D contact. Surface doping is carried out on the raised S/D contact and contact metallization is completed. Thereafter, an anneal process is carried out under conditions to cause solid-state, near-surface diffusion of the surface doping such that the electrical current conveying quality at the surface of the raised S/D is preserved and even improved.

In a process embodiment, annealing of the surface doping is carried out before contact metallization is completed.

Reference will now be made to the drawings wherein like structures may be provided with like suffix reference designations. In order to show the structures of various embodiments more clearly, the drawings included herein are diagrammatic representations of integrated circuit chips fabricated with surface-doped or near-surface doped contacts. Thus, the actual appearance of the fabricated chip substrates, alone or in chip packages, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings.

FIG. 1 is a cross-section elevation of an active device 100 that includes a semiconductive prominence 112 with a surface-enhanced doping concentration 114 that is a reaction zone according to an example embodiment. A semiconductive substrate 110 has been processed with a prominence 112 disposed thereon. In an embodiment, the prominence 112 is an epitaxial, raised S/D structure. In an embodiment, the prominence 112 is a raised S/D structure 112 such as an epitaxial S/D contact area for a transistor. The reaction zone 114 is seen between the prominence 112 and a contact 116 that is filled into a recess of an interlayer dielectric (ILD) layer 118. The ILD layer 118 may be referred to as a gate-level ILD layer 118. Where the prominence 112 is a raised S/D structure 112, a gate structure 120 is disposed adjacent the prominence 112. Details of the gate structure 120 may include a gate dielectric, gate dielectric spacers, a wordline, and agate dielectric cap.

Other structures may also be present. Metallization such as a contact interconnect 124 is disposed in a first interconnect ILD layer 122. Other metallization is represented as a trace 126 in a second interconnect ILD layer 128.

In an embodiment, the semiconductive substrate 110 is a semiconductor material such as but not limited to silicon (Si), silicon germanium (SiGe), germanium (Ge), or III-V compound semiconductors. The semiconductive substrate 110 can be monocrystalline, epitaxial crystalline, or polycrystalline. In an embodiment, the semiconductive substrate 110 is a semiconductor heterostructure such as but not limited to a silicon-on-insulator (SOI) substrate, or a multi-layered substrate comprising silicon, silicon germanium, germanium, III-V compound semiconductors, and any combinations thereof.

Active devices are located at the active surface and they refer to components such as but not limited to gates, transistors, rectifiers, and isolation structures that form parts of integrated circuits. In an embodiment, the semiconductive substrate 110 is semiconductive portion of a processor die such as that made by Intel Corporation of Santa Clara, Calif.

Figure 2:
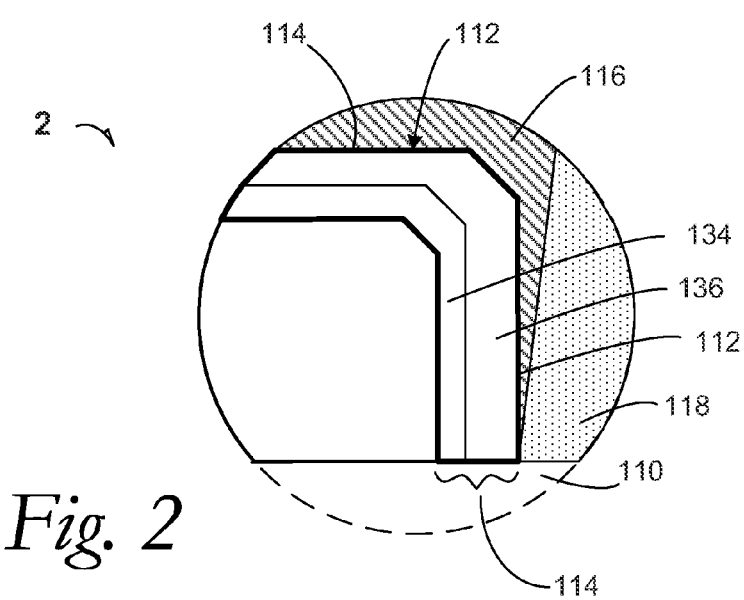
FIG. 2 is a detail section taken from FIG. 1 at the inset 2 according to an embodiment.

FIG. 2 is a detail section 2 taken from FIG. 1 at the inset 2 according to an embodiment. The semiconductive substrate 110 is seen with the semiconductive prominence 112. The reaction zone 114 is heavy outlined for enhanced clarity. Greater detail of the reaction zone 114 reveals surface-doping structures. A dopant transition zone 134 is seen adjacent the dopant-lean zone 132. And a dopant-rich zone 136 is seen adjacent the dopant transition zone 134.

In an embodiment, the surface-doping structures are largely homogeneous such as can be achieved by sufficient reaction time with surface dopants. In an embodiment, the reaction zone 114 is substantially homogeneous and it is retained as a near-surface structure such as required due to length and intensity of anneal processing and due to the amount of surface doping material that was presented onto the surface of the prominence 112 before annealing.

In an embodiment, the reaction zone 114 is about 2-10 nanometer (nm) thick (when viewed in the X-direction). The reaction zone 114 may be quantified as having been superficially diffused into the prominence by this 2-10 nm thickness embodiment. These increasingly small dimensions with respect to electrical current absolute limits of semiconductive atomic sizes (e.g., doped silicon) and semiconductive compound sizes (e.g. III-V materials), process embodiments counteract deactivation or depletion of useful semiconductive materials that can form such as native oxides and damage to the surface areas due to dopant activation anneals, etch- and surface cleaning treatments, and also damage from metal deposition processes.

Figure 1A:
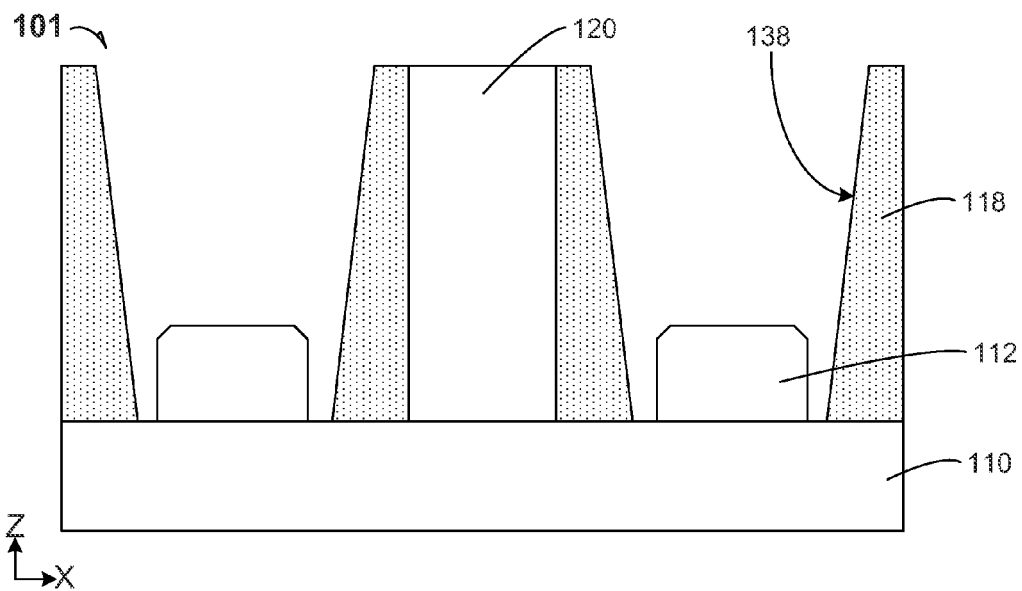
FIG. 1a is a cross-section elevation of the active device depicted in FIG. 1 during processing according to an example embodiment.

FIG. 1a is a cross-section elevation of the active device depicted in FIG. 1 during processing according to an example embodiment. The active device 101 includes the semiconductive substrate 110 and the prominence 112 disposed thereon. The gate structure 120 is depicted, but it may be a dummy structure that is sacrificial and will be replaced with a replacement gate during subsequent processing, depending upon a give useful processing scheme.

A recess 138 has been opened in the gate-level ILD layer 118 such as by a directional etch. The recess 138 shows a tapered form factor when viewed in X-Z dimensions. In an embodiment, the recess 138 is opened by an etch process that is selective to leaving the prominence 112 such as where the prominence is an epitaxial structure that is differently doped compared to doping of the semiconductive substrate 110. Consequently, an etch-selective result may be achieved where the etch is selective to leaving the prominence 112 and the semiconductive substrate 110, but it removes the ILD layer 118. Care is taken to etch the recess 138 to expose the prominence 112 in a centered exposure to facilitate further surface processing thereof. In an embodiment, the recess 138 is a contact trench 138. In an embodiment, the recess 138 is a contact via 138.

Figure 1B:
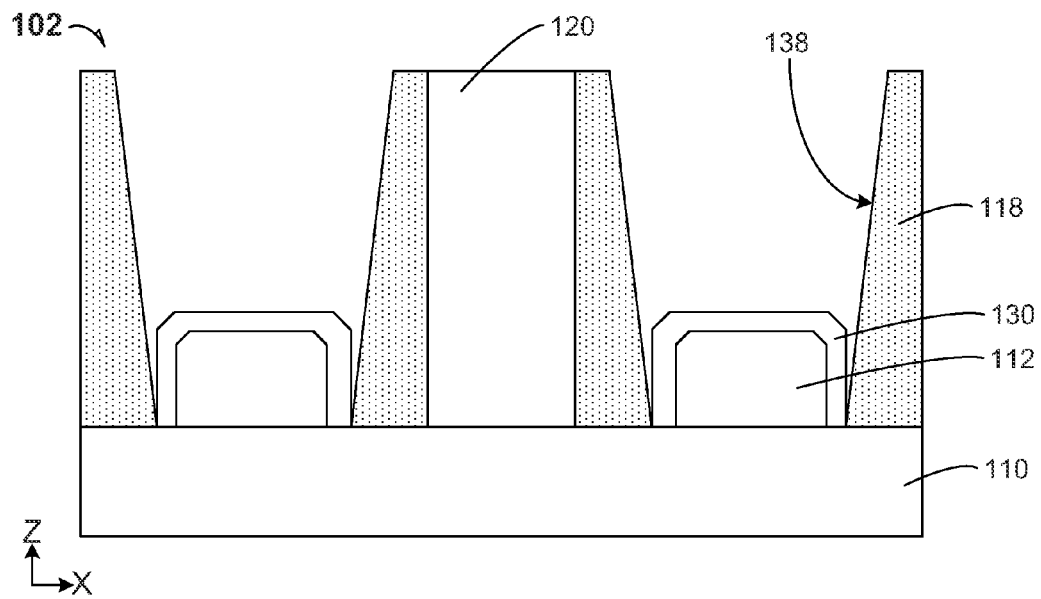
FIG. 1b is a cross-section elevation of the active device depicted in FIG. 1a after further processing according to an example embodiment.

FIG. 1b is a cross-section elevation of the active device depicted in FIG. 1a after further processing according to an example embodiment. The active device 102 has been processed by forming a surface-doping precursor structure 130 over the prominence 112.

In an embodiment, a surface-doping precursor structure 130 is formed by a wet chemical treatment such as by contacting a germanium-containing prominence 112 with a P-type dopant liquid that adheres to the surface of the prominence 112.

In an embodiment, the surface-doping precursor structure 130 is formed by a vapor-phase treatment. For example a vapor-phase treatment is used to form the surface-doping precursor structure 130 by an atomic-layer deposition (ALD) treatment. In an example embodiment, a vapor-phase treatment is used to form the surface-doping precursor structure 130 by a chemical vapor deposition (CVD) treatment. In an example embodiment, a vapor-phase treatment is used to form the surface-doping precursor structure 130 by a plasma-enhanced chemical vapor deposition (PECVD) treatment. In an example embodiment, a vapor-phase treatment is used to form the surface-doping precursor structure 130 by a physical vapor deposition (PVD) treatment, which may also be referred to as a sputtering treatment. In an example embodiment, a vapor-phase treatment is used to form the surface-doping precursor structure 130 by growing an in situ epitaxial film that grows into the surface-doping precursor structure 130.

In an example embodiment an ion-implantation process is carried out to surface implant the prominence 112 under low-energy plasma conditions. "Low-energy plasma" means an electrical bias is applied on the semiconductive device to attract ionized dopant atoms that are accelerated and impact the surface of the prominence 112 such that the dopant atoms are embedded closer to the surface of the prominence 112 than to the center of the prominence 112.

Thermal processing is done to the surface-doping precursor 130 in order to drive in dopant materials to the near-surface region of the prominence 112 and to prevent damage to the dopant-rich zone 136 that may occur such as native oxide formation during processing conditions.

Figure 1C:
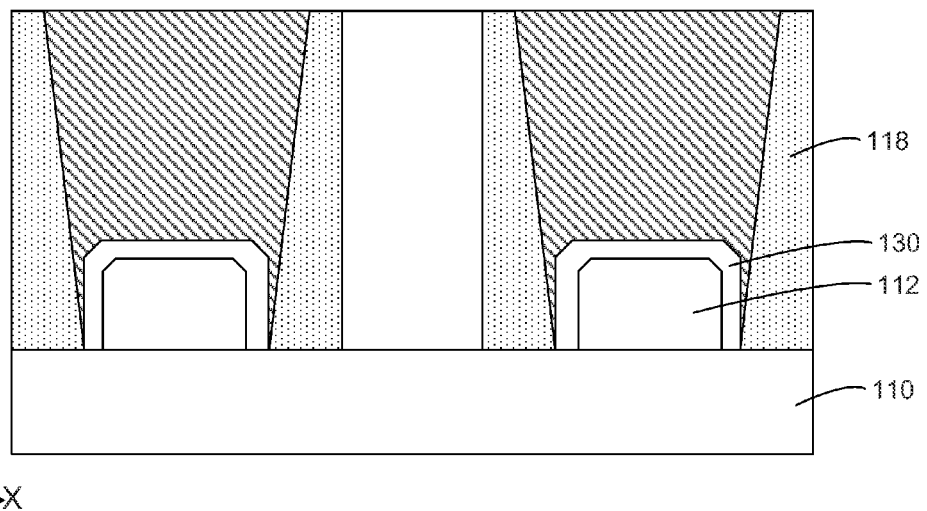
FIG. 1c is a cross-section elevation of the active device depicted in FIG. 1b after further processing according to an example embodiment.

FIG. 1c is a cross-section elevation of the active device depicted in FIG. 1b after further processing according to an example embodiment. In an embodiment, the dopant-rich zone 136 (see FIG. 2) is not formed until after formation of the contact 116. Under such processing embodiment conditions, damage to the surface-doping precursor structure 130 is of sufficiently low amount that formation of the dopant rich zone 136 by near-surface anneal may be postponed.

In a process embodiment, a flash lamp is used for annealing the prominence 112. The flash lamp uses electromagnetic radiation that is comprised of radiation having wavelengths across some portion of the electromagnetic spectrum. In a process embodiment, the electromagnetic radiation used to expose the prominence 112 with the precursor 130 includes radiation having wavelengths corresponding to the ultraviolet region of the electromagnetic spectrum (i.e., 10 to 400 nm). Such electromagnetic radiation may further include the visible light spectrum (i.e., 400 to 750 nm) and even into the infrared spectrum (i.e., 750 nm to 100 µm).

In an embodiment, electromagnetic radiation impinges the prominence 112 in a range from microseconds to hundreds of milliseconds. For example, one flash annealing process uses intense electromagnetic radiation for less than 10 milliseconds at a power level of at least 0.015 J/cm$^2$ (Joule per square centimeter).

Figure 1D:
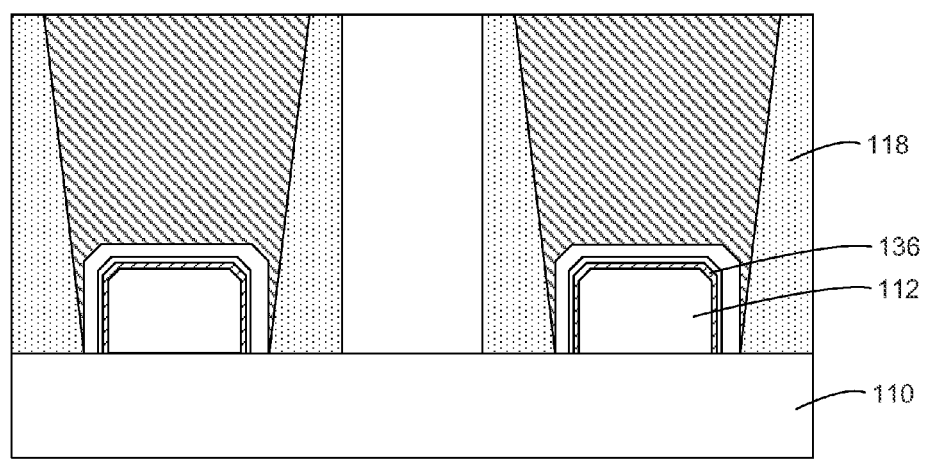
FIG. 1d is a cross-section elevation of the active device depicted in FIG. 1c after further processing according to an example embodiment.

FIG. 1d is a cross-section elevation of the active device depicted in FIG. 1b after further processing according to an example embodiment. In an embodiment, the dopant-rich zone 136 is pre-processed before the formation of the contact. Under such processing embodiment conditions, damage is avoided to the surface-doping precursor structure 130 (see FIG. 1b) in order to obtain a useful surface contact. Processing may be done by a flash anneal according to disclosed embodiments or conventional technique.

Figure 3:
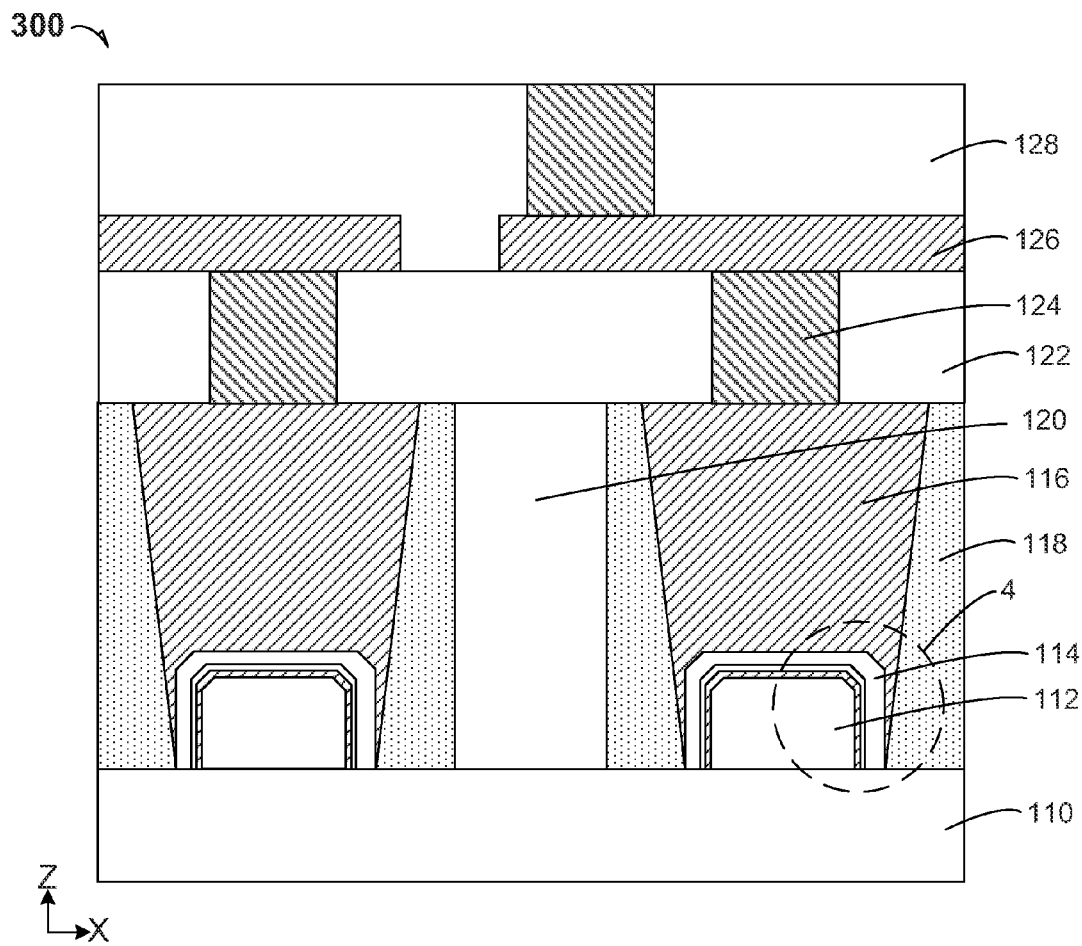
FIG. 3 is a cross-section elevation of an active device that includes a semiconductive prominence with a surface-enhanced doping concentration and in interlayer according to an example embodiment.

FIG. 3 is a cross-section elevation of an active device 300 that includes a semiconductive prominence 312 with a surface-enhanced doping concentration 314 and in interlayer 392 according to an example embodiment. A semiconductive substrate 310 has been processed with a prominence 312 disposed thereon. In an embodiment, the prominence 312 is an epitaxial, raised S/D structure. In an embodiment, the prominence 312 is a raised S/D structure 312 such as an epitaxial S/D contact area for a transistor.

Figure 4:
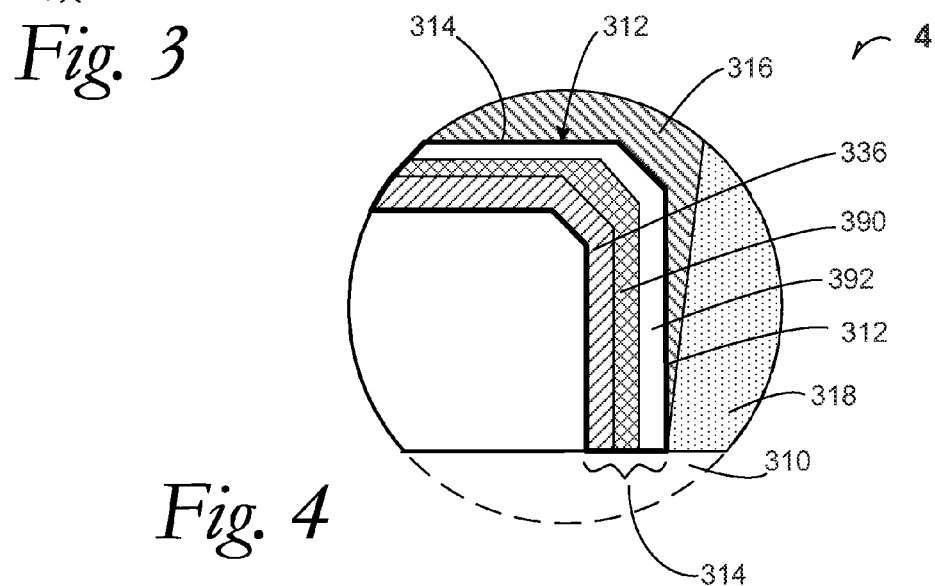
FIG. 4 is a detail section taken from FIG. 3 at the inset 4 according to an embodiment.

FIG. 4 is a detail section 4 taken from FIG. 3 at the inset 4 according to an embodiment. The semiconductive substrate 310 is seen with the semiconductive prominence 312. The reaction zone 314 is heavy outlined for enhanced clarity. Greater detail of the reaction zone 314 reveals surface-doping structures of an interlayer 392, a possible transition zone 390, and a near-surface area contact layer 336.

In an embodiment, the reaction zone 311 is about 2-10 nm thick (when viewed in the X-direction). These increasingly small dimensions with respect to current absolute limits of semiconductive atomic sizes (e.g., doped silicon) and semiconductive compound sizes (e.g. III-V materials), process embodiments counteract deactivation or depletion of useful semiconductive materials that can form such as native oxides and damage to the surface areas due to dopant activation anneals, etch- and surface cleaning treatments, and also damage from metal deposition processes.

A reaction zone 314 is seen between the prominence 312 and a contact 316 that is filled into a recess of an ILD layer 318. Part of the reaction zone 314 includes the interlayer 392 that acts as an insulator or semiconductor. For example, solid-state doping includes an interlayer 392 that is derived from the reaction zone 314. During processing, part of the interlayer 392 is consumed in doping the prominence 312 to form a near-surface area contact layer 336, but sufficient doping material remains to provide a useful Schottky barrier height reduction at the prominence 312 that is provided by the presence of the interlayer 392. A transition zone 390 may be found between the near-surface area contact layer 336 and the interlayer 392.

In an example embodiment, the prominence 312 is a material such as Si, SiGe or Ge and it is n-type doped with a material such as As. In an example embodiment, the prominence is a III-V InGaAs material and it is n-type doped with a material such as Si, Ge or Tl. The interlayer 392 is formed on the prominence 312 to reduce contact resistance for an NMOS device. In an example embodiment, a InAs interlayer 392 is formed on the prominence 312 to reduce contact resistance for an NMOS device.

Consequently, the dopant species is selected based upon the composition of the prominence 312. In an example embodiment for a Si- or Ge-based prominence 312 (Si, SiGe, or Ge) during the anneal, a partial breakdown of the interlayer precursor (such as the interlayer 392 is formed on the prominence 312 to reduce contact resistance for an As) causes arsenic to diffuse into the prominence 312 to enhance doping the near-surface area of the prominence, while a portion of the interlayer precursor remains to provide Schottky barrier-height reduction embodiments.

It may now be understood that processing embodiments of wet chemical treatment by a liquid dopant precursor may be practiced to achieve an interlayer 392. Such processing embodiments may be identical or similar to processing depicted in FIGS. 1a, 1b, 1c, and 1d. It may now be understood that processing embodiments of vapor-phase chemical treatment by a vapor deposition dopant precursor may be practiced to achieve an interlayer 392. It may now be understood that processing embodiments of implantation chemical treatment by ion implanting of dopant precursor may be practiced to achieve an interlayer 392.

The ILD layer 318 may be referred to as a gate-level ILD layer 318. Where the prominence 312 is a raised S/D structure 312, a gate structure 320 is disposed adjacent the prominence 312. Details of the gate structure 312 may include a gate dielectric, gate dielectric spacers, a wordline, and a gate dielectric cap.

Other structures may also be present. Metallization such as a contact interconnect 324 is disposed in a first interconnect ILD layer 322. Other metallization is represented as a trace 326 in a second interconnect ILD layer 328.

Figure 5:
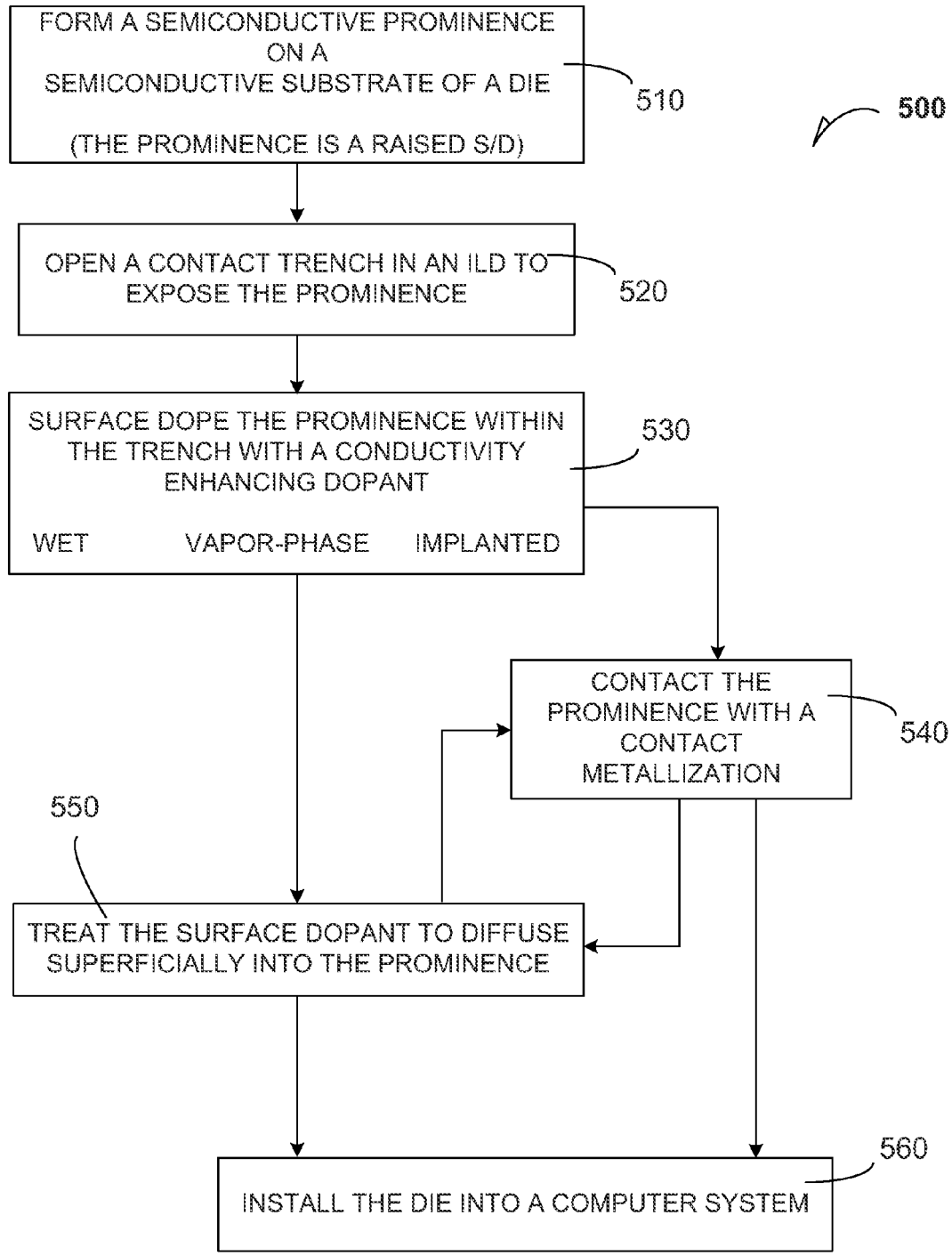
FIG. 5 is a process and method flow diagram according to an example embodiment.

FIG. 5 is a process and method flow diagram 500 according to an example embodiment. Processing is summarized in several stages and is not intended to include exhaustive processing details.

At 510, the process includes forming a prominence on a semiconductive substrate of a die.

At 520 the process includes opening a contact recess in an ILD to expose the prominence.

At 530, the process includes surface doping the prominence with a dopant. In an embodiment, surface doping is wet-chemically processed. In an embodiment, surface doping is vapor-phase processed. In an embodiment, surface doping is ion-implanting processed. In a non-limiting example embodiment, surface doping is configured to create both an interlayer 392 and a dopant-rich zone 336 such that both contact resistance is lowered and a useful Schottky barrier height reduction is achieved.

At 540, processing includes treating the surface dopant to diffuse superficially into the prominence. In a non-limiting example embodiment, thermal treatment includes a flash anneal with a processing time that lasts less than one second.

At 550, processing includes treating the surface dopant to diffuse superficially into the prominence. It is observed that processing at 550 may precede contacting the prominence with a contact metallization, depending upon a useful stage during processing where driving in the dopant will protect the surface of the contact from oxidation and other processing exposures.

At 560, a method embodiment includes installing the die into a computer system such as the computer system 600 depicted in FIG. 6.

FIG. 6 is a schematic of a computer system according to an embodiment. The computer system 600 (also referred to as the electronic system 600) as depicted can embody a surface-doped contact according to any of the several disclosed embodiments and their equivalents as set forth in this disclosure. An apparatus that includes a surface-doped contact that is assembled to a computer system.

The computer system 600 may be a Smartphone. The computer system 600 may be a tablet computer. The computer system 600 may be a mobile device such as a netbook computer. The computer system 600 may be a desktop computer. The computer system 600 may be integral to an automobile. The computer system 600 may be integral to a television. The computer system 600 may be integral to a DVD player. The computer system 600 may be integral to a digital camcorder.

In an embodiment, the electronic system 600 is a computer system that includes a system bus 620 to electrically couple the various components of the electronic system 600. The system bus 620 is a single bus or any combination of busses according to various embodiments. The electronic system 600 includes a voltage source 630 that provides power to an integrated circuit 610. In some embodiments, the voltage source 630 supplies current to the integrated circuit 610 through the system bus 620.

The integrated circuit 610 is electrically coupled to the system bus 620 and includes any circuit, or combination of circuits according to an embodiment. In an embodiment, the integrated circuit 610 includes a processor 612 that can be of any type of an apparatus that includes a surface-doped contact embodiment. As used herein, the processor 612 may mean any type of circuit such as, but not limited to, a microprocessor, a microcontroller, a graphics processor, a digital signal processor, or another processor. In an embodiment, SRAM embodiments are found in memory caches of the processor 612. Other types of circuits that can be included in the integrated circuit 610 are a custom circuit or an application-specific integrated circuit (ASIC), such as a communications circuit 614 for use in non-equivalent wireless devices such as cellular telephones, Smartphones, pagers, portable computers, two-way radios, and other electronic systems. In an embodiment, the processor 610 includes on-die memory 616 such as static random-access memory (SRAM). In an embodiment, the processor 610 includes embedded on-die memory 616 such as embedded dynamic random-access memory (eDRAM). Disclosed surface-doped contact embodiments and their art-recognized equivalents are integral memory cells in the eDRAM.

In an embodiment, the integrated circuit 610 is complemented with a subsequent integrated circuit 611 such as a graphics processor or a radio-frequency integrated circuit or both as set forth in this disclosure. In an embodiment, the integrated circuit is in a first die and the subsequent integrated circuit is in a second die that is packaged with the first die like a system-on-package (SoP). In an embodiment, the integrated circuit is in a first sector of a die and the subsequent integrated circuit is in a second sector of the die such as a logic-graphics system-on-chip (SoC) die like the Intel code-named SandyBridge™ processor die. In an embodiment, the dual integrated circuit 611 includes embedded on-die memory 617 such as eDRAM with any disclosed surface-doped contact memory cell embodiments. The dual integrated circuit 611 includes an RFIC dual processor 613 and a dual communications circuit 615 and dual on-die memory 617 such as SRAM. In an embodiment, the dual communications circuit 615 is particularly configured for RF processing.

In an embodiment, at least one passive device 680 is coupled to the subsequent integrated circuit 611 such that the integrated circuit 611 and the at least one passive device are part of the any apparatus embodiment that includes a surface-doped contact that includes the integrated circuit 610 and the integrated circuit 611. In an embodiment, the at least one passive device is a sensor such as an accelerometer for a tablet or Smartphone.

In an embodiment, the electronic system 600 includes an antenna element 682 such as any surface-doped contact embodiment set forth in this disclosure. By use of the antenna element 682, a remote device 684 such as a television, may be operated remotely through a wireless link by an apparatus embodiment. For example, an application on a smart telephone that operates through a wireless link broadcasts instructions to a television up to about 30 meters distant such as by Bluetooth® technology. In an embodiment, the remote device(s) includes a global positioning system of satellites for which the antenna element(s) are configured as receivers.

In an embodiment, the electronic system 600 also includes an external memory 640 that in turn may include one or more memory elements suitable to the particular application, such as a main memory 642 in the thrill of RAM, one or more hard drives 644, and/or one or more drives that handle removable media 646, such as diskettes, compact disks (CDs), digital variable disks (DVDs), flash memory drives, and other removable media known in the art. In an embodiment, the external memory 640 is embedded memory 648 such an apparatus that includes a surface-doped contact according to any disclosed embodiment.

In an embodiment, the electronic system 600 also includes a display device 650, and an audio output 660. In an embodiment, the electronic system 600 includes an input device such as a controller 670 that may be a keyboard, mouse, touch pad, keypad, trackball, game controller, microphone, voice-recognition device, or any other input device that inputs information into the electronic system 600. In an embodiment, an input device 670 includes a camera. In an embodiment, an input device 670 includes a digital sound recorder. In an embodiment, an input device 670 includes a camera and a digital sound recorder.

A foundation substrate 690 may be part of the computing system 600. The foundation substrate 690 is a motherboard that supports an apparatus that includes a die with a surface-doped contact embodiment. In an embodiment, the foundation substrate 690 is a board that supports an apparatus that includes a die with surface-doped contact embodiment. In an embodiment, the foundation substrate 690 incorporates at least one of the functionalities encompassed within the dashed line 690 and is a substrate such as the user shell of a wireless communicator.

As shown herein, the integrated circuit 610 can be implemented in a number of different embodiments, an apparatus that includes a die with a surface-doped contact according to any of the several disclosed embodiments and their equivalents, an electronic system, a computer system, one or more methods of fabricating an integrated circuit, and one or more methods of fabricating and assembling an apparatus that includes a die with a surface-doped contact according to any of the several disclosed embodiments as set forth herein in the various embodiments and their art-recognized equivalents. The elements, materials, geometries, dimensions, and sequence of operations can all be varied to suit particular I/O coupling requirements including dice with surface-doped contact embodiments and their equivalents.

Although a die may refer to a processor chip, a system-on-chip (SoC), an RF chip, an RFIC chip, or a memory chip may be mentioned in the same sentence, but it should not be construed that they are equivalent structures. Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

Terms such as "upper" and "lower" "above" and "below" may be understood by reference to the illustrated X-Z coordinates, and terms such as "adjacent" may be understood by reference to X-Y coordinates or to non-Z coordinates.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A contact on a semiconductive prominence, comprising:
   a group IV semiconductive substrate;
   a prominence disposed on the semiconductive substrate, wherein the prominence is a group IV semiconductor;
   a surface-doped structure comprising a III-V material on the prominence, wherein the III-V material has a larger lattice constant than the group IV semiconductor of the prominence at the interface of the III-V material and the group IV semiconductor of the prominence, wherein the surface-doped structure has a first concentration of a dopant and the prominence has a second concentration of the dopant, and wherein the first concentration of the dopant is different than the second concentration of the dopant; and
   a contact metallization having a contact metallization contact area coupled to the surface-doped structure, wherein the prominence has a prominence form factor, and wherein the contact metallization contact area reflects the prominence form factor.

2. The contact of claim 1, wherein the prominence is a first prominence, further including a second prominence, wherein the first- and second prominences are source- and drain contacts of a transistor.

3. The contact of claim 1, wherein the prominence is a first prominence, further including a second prominence, wherein the first- and second prominences are source- and drain contacts of a transistor that are spaced apart by a gate structure.

4. The contact of claim 1, wherein the prominence is a first prominence, further including a second prominence, wherein the first- and second prominences are source- and drain contacts of a transistor that are spaced apart by a gate structure, and further including a contact interconnect is disposed in a first interconnect ILD layer, wherein the contact interconnect contacts the contact metallization.

5. The contact of claim 1, wherein the III-V material affects Schottky barrier height reduction of the prominence.

6. The contact of claim 1, wherein III-V material forms a PMOS interlayer that affects Schottky barrier height reduction of the prominence.

7. The contact of claim 1, wherein the III-V material forms an NMOS interlayer that affects Schottky barrier height reduction of the prominence.

8. The contact of claim 1, wherein the contact metallization contacts the surface-doped structure.

9. The contact of claim 1, wherein the surface-doped structure on the prominence has a transition zone adjacent the prominence and a dopant-rich zone adjacent the contact metallization.

10. The contact of claim 1, wherein the surface-doped structure on the prominence has a transition zone adjacent the prominence, a dopant-rich zone adjacent the contact metallization, and a transition zone between the transition zone and the dopant-rich zone.

11. The contact of claim 1 wherein the prominence is silicon based.

12. A computer system comprising:
    a group IV semiconductive substrate of a die;
    a prominence disposed on the semiconductive substrate, wherein the prominence is a group IV semiconductor;
    a surface-doped structure comprising a III-V material on the prominence, wherein the III-V material has a larger lattice constant than the group IV semiconductor of the prominence at the interface of the III-V material and the group IV semiconductor of the prominence, wherein the surface-doped structure has a first concentration of a dopant and the prominence has a second concentration of the dopant, and wherein the first concentration of the dopant is different than the second concentration of the dopant; and
    a contact metallization having a contact metallization contact area coupled to the surface-doped structure, wherein the prominence has a prominence form factor, and wherein the contact metallization contact area reflects the prominence form factor; and
    a foundation substrate that supports the die.

13. The computer system of claim 12, wherein the foundation substrate is part of a device selected from the group consisting of mobile device, a smartphone device, a tablet computer device, a vehicle, and a television.

14. The computer system of claim 12, wherein the die is a first die and further including a subsequent integrated circuit of a second die that is packaged with the first die.

15. The computer system of claim 12, wherein the die includes the prominence in a logic first sector, and wherein the die has a graphics second sector with a subsequent integrated circuit.

* * * * *